United States Patent [19]
Chase et al.

[11] Patent Number: 6,087,060
[45] Date of Patent: Jul. 11, 2000

[54] METHOD OF MULTISTAGE DIGITAL PROOFING WITH DIMENSIONAL CONSISTENCY

[75] Inventors: Kenneth P. Chase, Merrimack; Gary Benner, Epsom; James Dalzell, Merrimack; Samuel D. Zerillo, Hillsboro, all of N.H.

[73] Assignee: Presstek, Inc., Hudson, N.H.

[21] Appl. No.: 09/310,604

[22] Filed: May 12, 1999

[51] Int. Cl.[7] .............................. G03C 11/12; G03F 7/34; G03F 7/40
[52] U.S. Cl. .......................... 430/201; 430/199; 430/200; 430/256; 430/257; 430/258
[58] Field of Search ................... 430/200, 201, 430/256, 257, 258, 235, 199

[56] References Cited

U.S. PATENT DOCUMENTS

| | | | |
|---|---|---|---|
| 4,686,163 | 8/1987 | Ng et al. | 430/47 |
| 5,126,760 | 6/1992 | DeBoer | 430/201 |
| 5,232,817 | 8/1993 | Kawakami et al. | 430/201 |
| 5,773,188 | 6/1998 | Ellis | 430/201 |

*Primary Examiner*—Richard L. Schilling
*Attorney, Agent, or Firm*—Cesari and McKenna, LLP

[57] ABSTRACT

Dimensional inconsistencies between a proof and an image to be overlaid thereon is avoided by subjecting both the proof image and the overlay image to the same heat treatment, thereby ensuring that both images undergo the same degree of shrinkage.

8 Claims, 2 Drawing Sheets

METHOD OF MULTISTAGE DIGITAL PROOFING WITH DIMENSIONAL CONSISTENCY

FIELD OF THE INVENTION

The present invention relates to digital printing apparatus and methods, and more particularly to a system for creating proofs using, for example, digitally controlled laser output.

BACKGROUND OF THE INVENTION

In offset lithography, a printable image is present on a printing member as a pattern of ink-accepting (oleophilic) and ink-rejecting (oleophobic) surface areas. Once applied to these areas, ink can be efficiently transferred to a recording medium in the imagewise pattern with substantial fidelity. Typically, the printing member first makes contact with a compliant intermediate surface called a blanket cylinder which, in turn, applies the image to the paper or other recording medium. In typical sheet-fed press systems, the recording medium is pinned to an impression cylinder, which brings it into contact with the blanket cylinder.

If a press is to print In more than one color, a separate printing plate corresponding to each color is required. Each set of cylinders associated with a particular color on a press is usually referred to as a printing station. Each such station typically includes an impression cylinder, a blanket cylinder, a plate cylinder and the necessary ink (and, in wet systems, dampening) assemblies. The recording material is transferred among the print stations sequentially, each station applying a different ink color to the material to produce a composite multicolor image.

The number of print stations on a press depends on the type of document to be printed. In typical printing processes, multicolor images cannot be printed directly using a single printing plate. Rather, composite color images are first decomposed into a set of constituent color components, or "separations," each of which serve as the basis for an individual plate. The colors into which the multicolor image is decomposed depends on the particular "color model" chosen by the practitioner. The most common color model is based on cyan, magenta, yellow and black constituents, and is referred to as the "CMYK" color model. If the separation is performed properly, combination of the individual separations produces the original composite image.

Graphic-arts practitioners use proofing sheets (or simply "proofs") to correct separation images prior to producing final separation plates, as well as to evaluate the color quality that will be obtained during the printing process. A proof represents, and permits the practitioner to view, the final image as it will appear when printed.

A proof may be produced by irradiative or thermal transfer of a coloring agent, corresponding to one of the separation colors, onto a receiver sheet according to the distribution of that color in the final image. Transfer sheets corresponding to each color of the model can be applied to a single receiver sheet and sequentially imaged, producing a single-sheet proof of the final image. Alternatively, each of the color separations can be applied to a separate transparent receiver sheet, and the set of sheets superposed on each other in registration to reveal the final image.

Proofs can also allow the practitioner to preview the results of varying the separations or adding further elements to the composite. For example, one of the process colors can be emphasized to different degrees on separate transparent receiver sheets, and the different sheets alternatively combined with the remaining proofing sheets (representing the other process colors) to find the best combination. In other cases, the effect of adding of a further process or spot color (e.g., a metallic or a PANTONE color ) or a specialty application (e.g., spot lacquer, selectively applied varnish, etc.) to the standard color model can be examined by producing one or more additional transparent receiver sheets with the new color and overlaying this sheet on the four-color proof.

Because it is cumbersome to maintain registration among separate receiver sheets for the various colors, it is preferred to apply as many colors as possible to a single proofing sheet, viewing variations using transparent overlays. In the situation where a single process color is being varied, the remaining colors can be applied to a single-sheet proof and different transparent receiver sheets—each reflecting a different emphasis of the omitted color—overlaid thereon. Where the effect of adding colors beyond the standard model (or duplicating one of the colors for emphasis) is to be examined, a single-sheet proof of the image may be prepared and each additional color applied to a different transparent receiver sheet that may be overlaid onto the proof.

The single-sheet proof is most simply the receiver sheet itself, which has received some or all of the process colors. But printing is most typically performed on paper, which imparts its own visual impact; the appearance of a four-color image applied to a plastic receiver sheet will differ from the same image applied to paper. As a result, when comparing the effects of different printing variations, practitioners prefer to work with a paper proof against which the different transparencies are overlaid or laminated.

Conventional transfer materials are difficult to apply directly to paper. Consequently, a paper proof is typically prepared indirectly: first the separation colors are sequentially applied to a plastic receiver sheet to form the single-sheet proof described above, and the image of this proof is then transferred to paper by a heating process (such as lamination). Although this process produces a proof with substantial fidelity, the heating process shrinks both the receiver sheet and the paper substrate. The overlay, which has not undergone a heating process, cannot thereafter be registered against the paper proof with precision; its image has not undergone dimensional change, and is not the same size as the image on paper. Accordingly, there exists a need for a way to retain dimensional consistency between paper proofs and transparent image-bearing overlays created for use therewith.

DESCRIPTION OF THE INVENTION

Brief Summary of the Invention

In accordance with the present invention, the proof image—that is, all or some of the separation colors—and the image to be overlaid are applied to opposite sides of a transfer sheet. These images may be applied to the transfer sheet by, for example, a thermal operation such as laser-ablation transfer ("LAT") or melt transfer. The coated (donor) transfer side of the sheet, which contains the proof image, is then applied to a substrate (typically, although not necessarily, a paper sheet) under conditions that cause thermal transfer of the image to the substrate (e.g., by lamination). The overlay image is not harmed by thermal transfer of the proof image, whose departure from the receiver sheet clears that side of the sheet. As a result, the receiver sheet can serve as an overlay transparency. Because it has undergone the same degree of shrinkage as the proof, the overlay image is dimensionally consistent with the proof and may be precisely registered therewith.

The step of applying the overlay image to the transfer sheet may take place before the proof image is transferred to the substrate or, depending on the source of the overlay image, may occur contemporaneously with transfer of the proof image. For example, the proof image may be laminated to the transfer sheet from a second carrier as the proof image is laminated onto the substrate.

BRIEF DESCRIPTION OF THE DRAWINGS

The foregoing discussion will be understood more readily from the following detailed description of the invention, when taken in conjunction with the accompanying drawings, in which.

DETAILED DESCRIPTION OF THE PREFERRED EMBODIMENTS

Figure 1A:
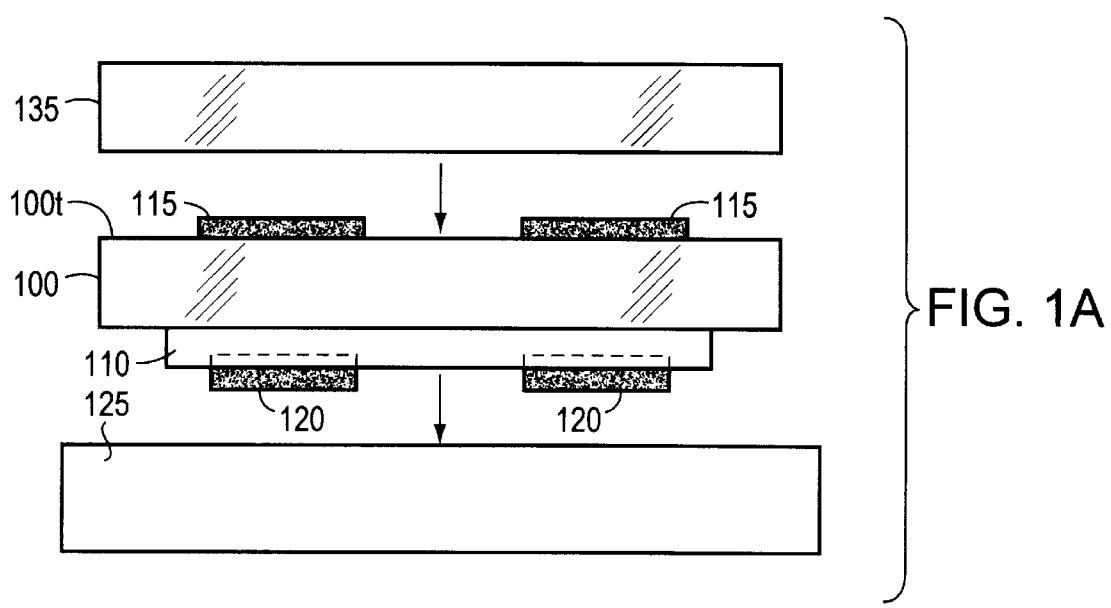
FIGS. 1A–1C are end views of a first embodiment of the invention, which utilizes a single transfer sheet.
Figure 1B:
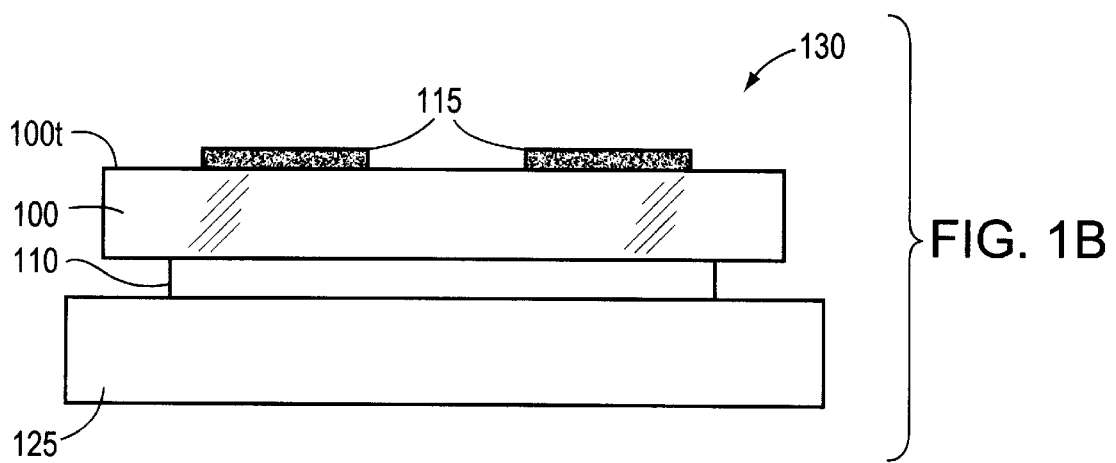
Figure 1C:
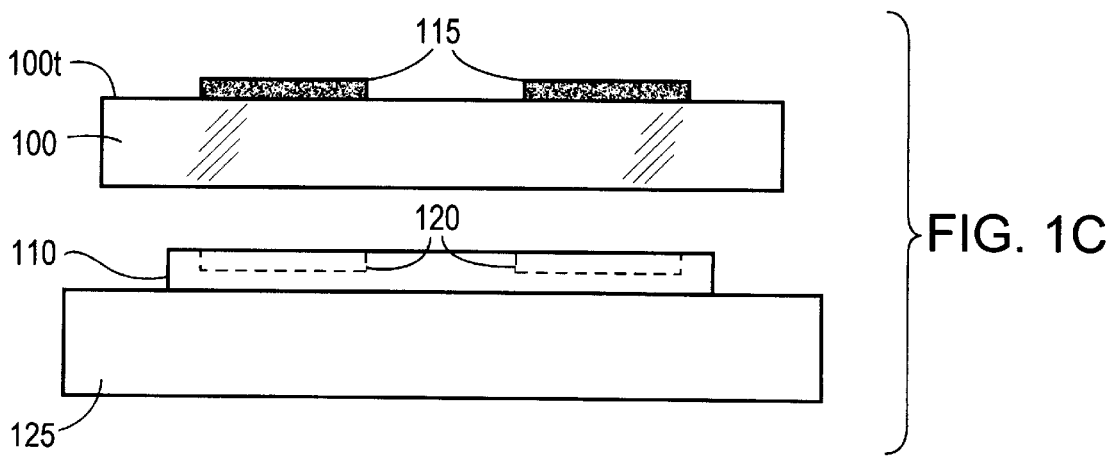

With reference to FIGS. 1A–1C, a transparent transfer sheet 100, which may be a polyester or other suitable clear film, is provided on one side thereof with a thermal-transfer coating 110; the other (top) side 100t has no coating. Coating 10 may be any of the commercially available thermoplastic transfer coatings well known to those skilled in the art.

The overlay image, indicated by the two visible image fragments 115, is applied to the side 100t. The proof image, indicated by the two visible image fragments 120, is applied to the coating 10. Both images 115, 120 are applied by a transfer process, and layer 120 may comprise multiple layers (each representing a different process color).

LAT systems suitable for applying the overlay and proofing images are described, for example, in U.S. Pat. Nos. 3,945,318; 3,962,513; 3,964,389; 4,245,003; 4,395,946; 4,588,674; and 4,711,834. With these systems, a polymer donor sheet transparent to the radiation emitted by the imaging laser is coated with a transferable coloring agent. During operation, the transfer side of this construction is brought into contact with coating 110 or side 100t of sheet 100, and the transfer material is selectively irradiated through the transparent layer. Typically, the transfer material exhibit s a high degree of absorbence for imaging laser radiation, and ablates—that is, virtually explodes into a cloud of gas and charred debris—in response to a laser pulse. This action, which may be further enhanced by self-oxidation (as in the case, for example, of nitrocellulose materials), effects removal of the transfer material from its carrier. Material that survives ablation adheres to sheet 100, and the polymer donor sheet, with the remaining (unirradiated) material, is removed.

The transfer material need not undergo ablation. For example, U.S. Pat. No. 5,81 9,661 describes a non-ablative thermal-transfer technique in which a laser pulse reduces the viscosity of a transfer material to a flowable state. The material exhibits a higher melt adhesion for a paper substrate than for the donor sheet to which it is initially bound, so that in a flowable state it transfers completely to the substrate.

Alternatively, instead of laser activation, transfer of the colored material can be accomplished through direct contact. U.S. Pat. No. 4,846,065, for example, describes the use of a digitally controlled pressing head to transfer oleophilic material to an image carrier.

Suitable imaging systems can take a variety of forms. Laser output, for example, may be provided directly to the transfer carrier via lenses or other beam-guiding components, or transmitted to the surface from a remotely sited laser using a fiber-optic cable. A controller (and associated positioning hardware) maintains the beam output at a precise orientation with respect to the carrier surface, scans the output over the surface, and activates the laser at positions adjacent selected points or areas of the carrier. The controller responds to incoming image signals corresponding to the image separation being transferred. The image signals are stored as a bitmap data file on a computer, and may be generated by a raster image processor (RIP) or other suitable means. For example, a RIP can accept input data in page-description language, which defines all of the features of the image, or as a combination of page-description language and one or more image data files. The bitmaps are constructed in accordance with selected prepress parameters such as screen frequency and angle. See, e.g., U.S. Pat. Nos. 5,385,092; Re. 35,512; and 5,822,345.

As shown in FIG. 1A, the side of transfer sheet 100 to which coating 110 adheres is brought into contact with a substrate 125 (such as a paper or plastic sheet), forming a sandwich 130 as shown in FIG. 1B. Sandwich 130 is subjected to heat treatment, e.g., lamination, causing coating 110 and the image previously applied thereto to transfer onto substrate 125, as shown in FIG. 1C. If necessary, a protective sheet 135 (see FIG. 1A) may be applied to surface 100t to prevent backtransfer (and resultant degradation) of image 115 during the transfer process. Because the images 115, 120 will have undergone identical degrees of shrinkage as a result of thermal exposure, they remain dimensionally consistent, and image 115 may be registered over image 120 with precision.

Figure 2A:
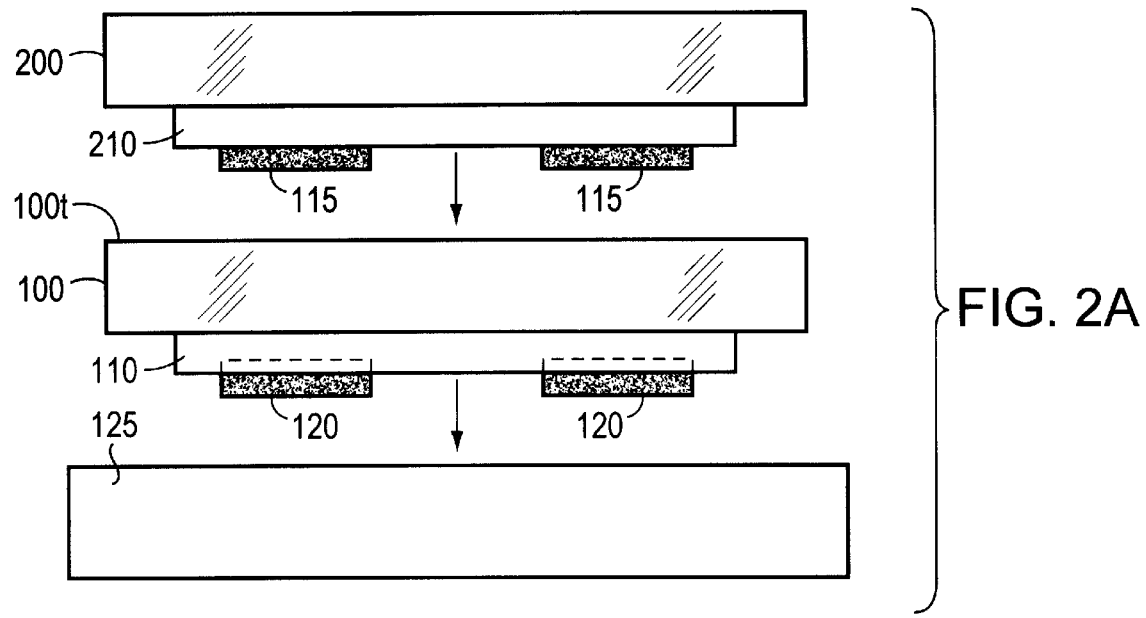
FIGS. 2A and 2B are end views of a second embodiment of the invention, which utilizes multiple transfer sheets.
Figure 2B:
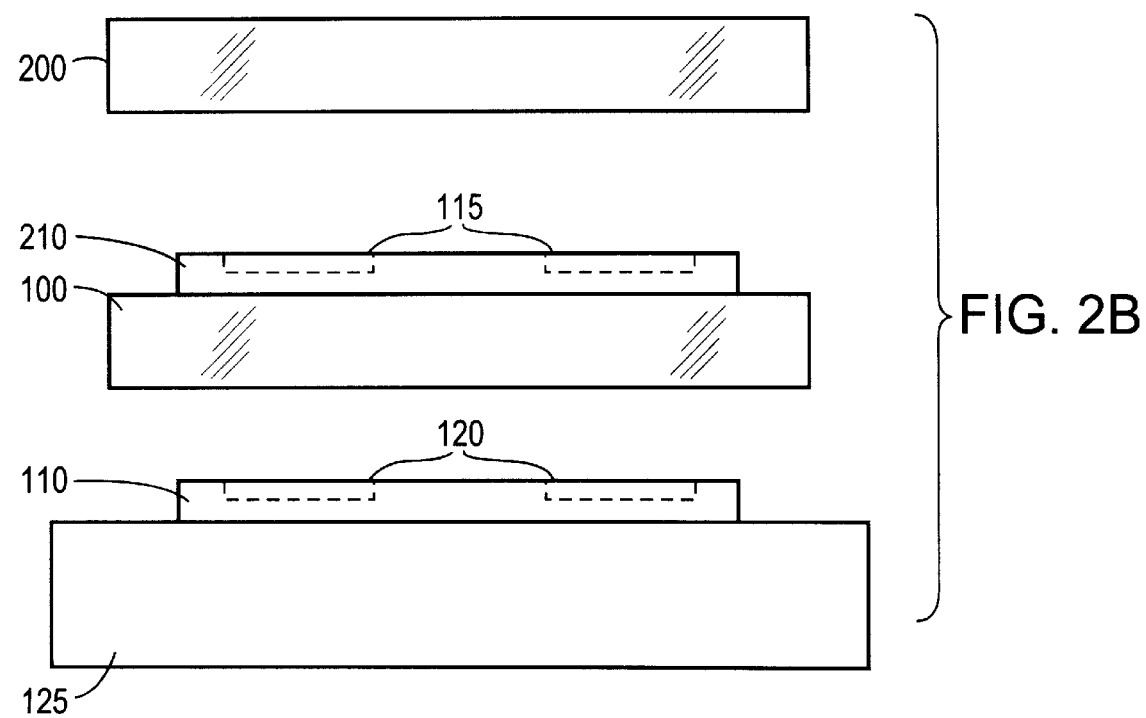

As shown in FIGS. 2A and 2B, image 115 need not be applied to transfer sheet 100 in a separate step. Instead, image 115 may be applied to the transfer coating 210 of a second transfer sheet 200, and sheets 100, 200 and the substrate 125 brought into contact to form a sandwich structure. This structure is subjected to heat treatment, resulting in simultaneous transfer of image 115 to transfer sheet 100 and transfer of image 120 to substrate 125. Again, the images 15, 120 undergo identical amounts of shrinkage, and sheet 100 may be used as a transparent overlay. One advantage to this approach is that image 115 is never exposed to heat outside the context of a transfer operation, and special provision for its protection therefore need not be made. Moreover, this approach allows images 115, 120 to be applied to respective transfer sheets 100, 200 in a single process and then transferred in a single process, obviating the need to perform two separate image application s to opposite sides of sheet 100.

It will therefore be seen that the foregoing represents a thermal approach to production of proofs that avoids the dimensional inconsistency heretofore encountered in such processes. The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of multistage digital proofing, the method comprising the steps of:

a. providing a transparent receiver sheet having first and second sides;

b. transferring, onto a first side of the receiver sheet, a first imagewise pattern comprising at least one color;

c. transferring, onto a second side of the receiver sheet, a second imagewise pattern comprising at least one color and dimensionally consistent with the first imagewise pattern; and d. thermally transferring the first imagewise pattern onto a substrate without causing substantial damage to the second imagewise pattern on the receiver sheet, thereby rendering substantially uncolored the first side of the receiver sheet and facilitating removable registration of the second imagewise pattern with the transferred first imagewise pattern notwithstanding shrinkage of the receiver sheet or the substrate.

2. The method of claim 1 wherein the first imagewise pattern is transferred onto the receiver sheet according to steps comprising:

a. providing a donor sheet comprising a thermally transferable colored material;

b. contacting the donor sheet with the first surface of the receiver sheet; and c. heating the donor sheet so as to cause transfer of the colored material in the first imagewise pattern.

3. The method of claim 2 further comprising repeating steps (a)–(c) for at least a second donor sheet of a different color in register with the first imagewise pattern on the receiver sheet.

4. The method of claim 1 wherein the step of thermally transferring comprises lamination.

5. The method of claim 1 wherein the second imagewise pattern is transferred onto the receiver sheet according to steps comprising:

a. providing a donor sheet comprising a thermally transferable colored material;

b. contacting the donor sheet with the second surface of the receiver sheet; and c. heating the donor sheet so as to cause transfer of the colored material in the second imagewise pattern.

6. The method of claim 5 further comprising repeating steps (a)–(c) for at least a second donor sheet of a different color in register with the second imagewise pattern on the receiver sheet.

7. The method of claim 5 wherein the first imagewise pattern is transferred onto the substrate simultaneously with transfer of the second imagewise pattern onto the receiver sheet.

8. The method of claim 1 wherein the second imagewise pattern is transferred by lamination.

* * * * *